United States Patent [19]

Isozaki

[11] Patent Number: 5,406,569
[45] Date of Patent: Apr. 11, 1995

[54] ERROR CORRECTING APPARATUS FOR DIGITAL DATA AND DIGITAL SYNCHRONIZING DETECTING APPARATUS

[75] Inventor: Masaaki Isozaki, Kanagawa, Japan

[73] Assignee: Sony Corporation, Tokyo, Japan

[21] Appl. No.: 966,844

[22] Filed: Oct. 27, 1992

[30] Foreign Application Priority Data

Oct. 31, 1991 [JP] Japan .................................. 3-286386
Oct. 31, 1991 [JP] Japan .................................. 3-286781

[51] Int. Cl.⁶ ............................................. H03M 13/00
[52] U.S. Cl. ........................................ 371/42; 375/368
[58] Field of Search ................... 371/37.1, 37.8, 42; 370/100.1, 105.1; 375/116

[56] References Cited

U.S. PATENT DOCUMENTS

| | | | |
|---|---|---|---|
| 4,682,333 | 7/1987 | Onishi et al. ........................ | 371/37.4 |
| 5,022,029 | 6/1991 | Gulchon ............................... | 371/38.1 |
| 5,150,381 | 9/1992 | Forney, Jr. et al. .................. | 371/39 |
| 5,285,454 | 2/1994 | Blaum et al. ......................... | 371/37.1 |

*Primary Examiner*—Paul P. Gordon
*Attorney, Agent, or Firm*—William S. Frommer; Alvin Sinderbrand

[57] ABSTRACT

The present invention is directed to a digital data error correcting apparatus in which an error correction capability can be considerably improved in a digital signal transmission system when a digital modulation code is decoded. In a minimum distance decoding method, when a plurality of reference samples having equal minimum Hamming distance relative to a digital modulation code exist, on the basis of the probability that an error will occur in the respective bits, respective bits are weighted, and a reference sample having the minimum distance from the input sample is selected from a plurality of reference samples to thereby correct an error. Further, the present invention is directed to a digital sync. detection apparatus in which an ability for detecting a sync. pattern can be considerably improved without degrading the probability that a pseudo-sync. signal will occur. A detection interval of a predetermined cycle is set in a sync. pattern of a predetermined cycle whose Hamming distance between it and a digital modulation code is larger than k by a detection window signal generator circuit (40), and (k−1) bit error of the sync. pattern can be corrected during this detection interval.

11 Claims, 11 Drawing Sheets

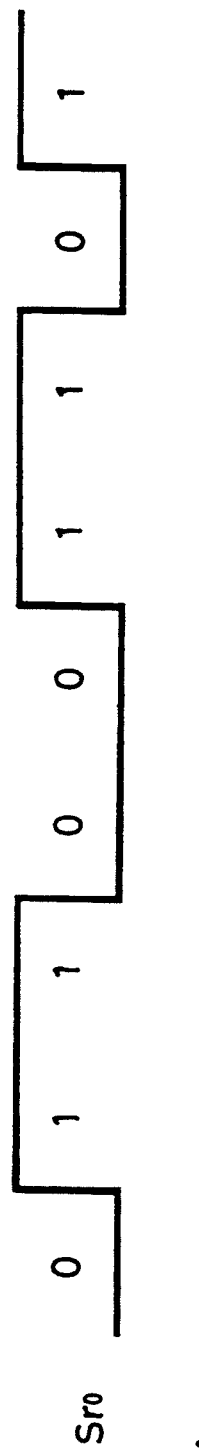
FIG. 10A
FIG. 10B

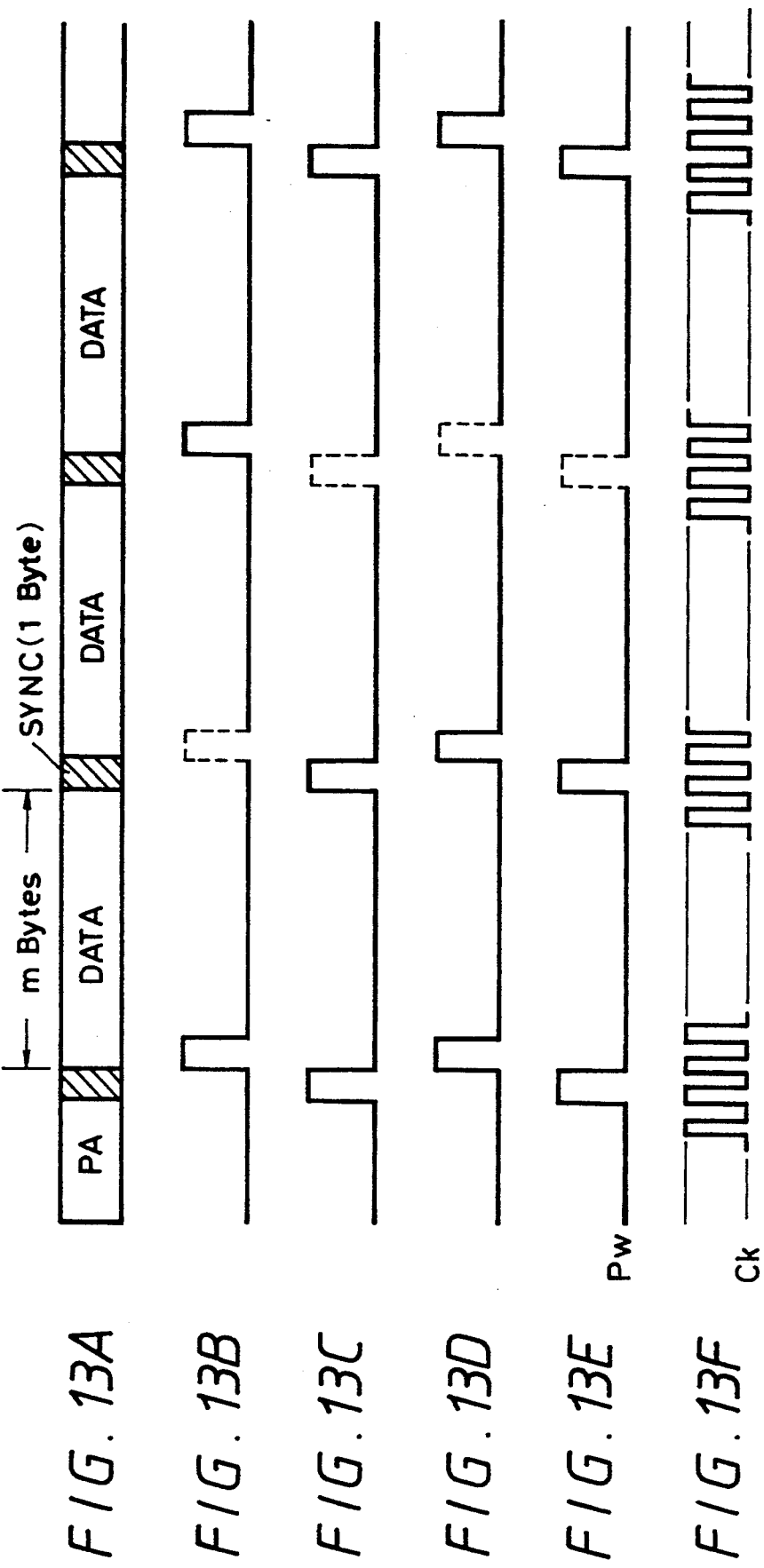

ERROR CORRECTING APPARATUS FOR DIGITAL DATA AND DIGITAL SYNCHRONIZING DETECTING APPARATUS

BACKGROUND OF THE INVENTION

1. Field of the Invention

The present invention relates to an error correcting apparatus for digital data and a digital synchronizing detecting apparatus.

2. Description of the Prior Art

It is customary that, when a digital information is transmitted, an error that takes place in a transmission line is detected and then corrected.

According to the coding theory, a fundamental theory for error correction lies in that a Hamming distance between code words (symbol sequences) is large.

Of pairs of symbols located on two symbol sequences u and v of the same length at their corresponding positions, the number of different pairs is called a Hamming distance of symbol sequences u and v. The Hamming distance is expressed as $d_H(u, v)$. The Hamming distance will sometimes be referred to as simply a distance in the description which follows.

In a block code in which lengths of all code words are finite and equal, a minimum value of Hamming distance between different code words is called a minimum (Hamming) distance. This minimum (Hamming) distance is expressed as $d_{min}$.

As shown in FIG. 1 of the accompanying drawings, sets of symbol sequences each having a distance less than t from code words $c_i$, $c_j$ are conceptually expressed by circles having a radius t and centers $c_i$ and $c_j$, respectively. The above sets have no common portion when the following condition is established:

$$d_{min} \geq 2t+1$$

If e ($\leq$t) errors occur in a transmission line when the code word $c_i$ of the block code is transmitted and a code word r is received, then e is expressed as:

$$e = d_H(c_i, r) \leq t$$

At that time, the following condition is established for an arbitrary code word $c_j$ other than the code word $c_i$.

$$d_H(c_j, r) < t$$

If it is determined that a code word x that satisfies $d_H(x, r) \leq t$ is transmitted for the received word r, then error less than t errors (t-fold) can be corrected thoroughly.

Code words whose $d_{min}$ is more than $2t_2+1$ can correct errors of $t_1$ fold and can detect errors of $t_1$ and $t_2$ fold.

In conventional magnetic recording of a digital signal, taking electro-magnetic characteristics into consideration, original data are converted into proper modulation codes such as 8–10 converted modulation code, 8–14 modulation code or the like, having at least less DC component and less consecutive bits of the same polarity, and then are recorded.

Usually, in the modulation code, according to a predetermined modulation rule (rule), sample data corresponding to all input data sequences are stored in a ROM (read only memory) as a table.

If incorrect sample data, which are not included in the ROM table, are obtained departing from the modulation rule due to errors mainly occurring in the electromagnetic system upon playback, then on the basis of all samples in the ROM table, the Hamming distances between them and the reference sample are calculated by the comparison of incorrect samples with the reference samples in a one-to-one fashion. The incorrect sample is decoded to a sample whose Hamming distance is closest to the reference sample. That is, the error is corrected according to the minimum distance decoding method.

In the magnetic recording of the digital signal, the distance between code words is generally short due to the restrictions concerning the modulation code as described before. There is then the problem that a satisfactory error correction capability cannot be always obtained according to the conventional minimum distance decoding method.

As shown in FIG. 2 of the accompanying drawings, if incorrect sample data $e_1$, $e_2$, $e_3$ are obtained outside a modulation code space Rc, then the incorrect sample data $e_1$ includes a code word $c_2$ which has the minimum distance within the modulation code space Rc so that the error can be corrected.

The incorrect sample $e_2$, however, includes two minimum distance code words $c_4$, $c_5$ within the space Rc so that the error cannot be corrected by the minimum distance decoding method.

Let it now be assumed that upon playback a sample Spb="011001001" is obtained in the magnetic recording and reproducing system that employs the 3–9 modulation shown on the following table 1.

In the sample Spb, only #2 bit is different from a first row reference sample Sr0="011001101" corresponding to an original signal "0" on the table 1 and only #3 bit is different from a reference sample Sr1="011100001" corresponding to a second row original signal "1".

In this case, the reproduced sample Spb has the Hamming distance [1] between it and both the reference samples Sr0, Sr1. Therefore, the reproduced sample Spb cannot specify the closest sample and can only detect the error.

TABLE 1

| ORIGINAL SIGNAL | INTERMEDIATE DATA (NRZ) | 3-9 MODULATION CODE ||||||||
|---|---|---|---|---|---|---|---|---|---|
| | | #8 | 7 | 6 | 5 | 4 | 3 | 2 | 1 | 0 |
| 0 | 0 0 0 | 0 | 1 | 1 | 0 | 0 | 1 | 1 | 0 | 1 |
| 1 | 0 0 1 | 0 | 1 | 1 | 0 | 0 | 0 | 0 | 0 | 1 |
| 2 | 0 1 0 | 0 | 1 | 1 | 1 | 0 | 0 | 0 | 0 | 1 |
| 3 | 0 1 1 | 0 | 1 | 0 | 0 | 0 | 0 | 0 | 1 | 1 |
| 4 | 1 0 0 | 0 | 1 | 1 | 1 | 1 | 0 | 0 | 0 | 1 |
| 5 | 1 0 1 | 0 | 0 | 1 | 1 | 1 | 0 | 0 | 0 | 1 |
| 6 | 1 1 0 | 0 | 0 | 0 | 0 | 1 | 1 | 1 | 1 | 1 |
| 7 | 1 1 1 | 0 | 0 | 0 | 1 | 1 | 0 | 0 | 0 | 1 |

When the digital information is transmitted, a synchronizing (sync.) signal of a predetermined pattern is inserted into a digital information DATA at a proper cycle following a pre-amble PA, as shown in FIG. 3 of the accompanying drawings.

As the above sync. signal, there is selected a sync. signal of a pattern whose Hamming distance for all digital modulation codes is large. For the modulation codes shown on the following table 2, the following sync. pattern Csy is selected so as to have a Hamming distance of 2 or more.

Csy="00111110"

TABLE 2

| ORIGINAL SIGNAL | INTERMEDIATE DATA | MODULATION CODE #7 6 5 4 3 2 1 0 | | | | | | | | DISTANCE TO SYNC. PATTERN |
|---|---|---|---|---|---|---|---|---|---|---|
| 0 | 0 0 | 0 | 0 | 1 | 1 | 0 | 0 | 1 | 1 | 3 |
| 1 | 0 1 | 0 | 1 | 1 | 0 | 0 | 1 | 1 | 1 | 5 |
| 2 | 1 0 | 0 | 0 | 0 | 1 | 1 | 1 | 0 | 0 | 2 |
| 3 | 1 1 | 0 | 0 | 1 | 1 | 0 | 0 | 0 | 1 | 4 |

As is conventional, the sync. pattern is not error-corrected due to the following reason:

A special pattern having a large Hamming distance for all digital modulation codes is selected as the sync. pattern as described before so that, if the error in the sync. pattern is corrected, the Hamming distance of the sync. pattern for the digital modulation code is reduced and the error correction becomes meaningless.

There is then the problem that the probability that an error will occur in the sync. pattern itself is increased.

Further, if the error in the sync. pattern is forcibly corrected, then the smaller the Hamming distance relative to the digital modulation code becomes, the more the number of patterns which are regarded as the sync. pattern is increased. There is then the problem that the probability that the modulation code will be changed to the sync. pattern due to the occurrence of error is increased, i.e., the probability that the pseudo-sync. signal will occur is increased.

When the distance between an error pattern to be corrected and the modulation code is short, the probability that the pseudo-sync. signal will occur tends to be deteriorated.

If the above sync. pattern Csy is changed as shown on the following table 3 due to one-bit error, then a third row error pattern Cec="00011110" corresponding to "C" on the table 3 is different only in #1 bit from a modulation code Cm2="00011100" corresponding to the original signal "2" on the table 2. Further, a seventh row error pattern Ceg="00111100" corresponding to "g" on the table 3 is different only in #5 bit from the modulation code Cm2 corresponding to "2" on the table 2.

TABLE 3

| ERROR NUMBER | ERROR PATTERN #7 6 5 4 3 2 1 0 | | | | | | | |
|---|---|---|---|---|---|---|---|---|
| a | 1 | 0 | 1 | 1 | 1 | 1 | 1 | 0 |
| b | 0 | 1 | 1 | 1 | 1 | 1 | 1 | 0 |
| c | 0 | 0 | 0 | 1 | 1 | 1 | 1 | 0 |
| d | 0 | 0 | 1 | 0 | 1 | 1 | 1 | 0 |
| e | 0 | 0 | 1 | 1 | 0 | 1 | 1 | 0 |
| f | 0 | 0 | 1 | 1 | 1 | 0 | 1 | 0 |
| g | 0 | 0 | 1 | 1 | 1 | 1 | 0 | 0 |
| h | 0 | 0 | 1 | 1 | 1 | 1 | 1 | 1 |

As conceptually shown in FIG. 4 of the accompanying drawings, a Hamming distance between the error patterns Cec, Ceg within one-bit error space Re1 and the modulation code Cm2 within the modulation code space Rc becomes [1]. It is natural that the one-bit error patterns Cec, Ceg have a Hamming distance [1] between them and the sync. pattern Csy.

Accordingly, each of the error patterns Cec, Ceg has the equal distance between it and the sync. pattern Csy and the modulation code Cm2 and equal to them in probability so that the error patterns Cec, Ceg cannot be corrected. If the error patterns Cec, Ceg are forcibly corrected, then the probability that the pseudo-sync. signal will occur is deteriorated.

OBJECTS AND SUMMARY OF THE INVENTION

Therefore, it is a general object of the present invention to provide an improved digital data error correcting apparatus in which the aforesaid shortcomings and disadvantages of the prior art can be eliminated.

It is a further general object of the present invention to provide an improved digital sync. detection apparatus in which the aforesaid shortcomings and disadvantages of the prior art can be eliminated.

More specifically, it is an object of the present invention to provide a digital data error correcting apparatus in which an error correction capability can be considerably improved in a digital signal transmission system when a digital modulation code is decoded.

It is another object of the present invention to provide a digital sync. detection apparatus in which an ability for detecting a sync. pattern can be considerably improved in a digital signal transmission system without degrading the probability that a pseudo-sync. signal will occur.

As a first aspect of the present invention, there is provided a digital data error correcting apparatus which includes data sequence comparing means for comparing input data sequence supplied thereto via a predetermined transmission system and a group of reference data sequences of the same length as the input data sequence at every bit and data sequence selecting means for selecting the reference data sequence whose distance between it and the input data sequence is minimized on the basis of an output of the data sequence comparing means. This digital data error correcting apparatus comprises weighting means for adding weights based on the probability that an error will occur in the predetermined transmission system to every bit of the group of reference data sequence, and second data sequence selecting means for selecting the data sequence whose distance relative to the input data sequence is minimized from a plurality of data sequences corresponding to a plurality of reference data sequences and which are weighted by the weighting means when the plurality of reference data sequences are selected by the data sequence selecting means. According to the thus arranged digital data error correcting apparatus, an error correction capability can be remarkably improved in a digital signal transmission system when a digital modulation code is decoded.

As a second aspect of the present invention, there is provided a digital sync. detection apparatus which detects a sync. data sequence of a predetermined pattern inserted into a series of input data sequences at a predetermined cycle and whose distance relative to the input data sequence becomes more than k from the series of input data sequences. This digital sync. detection apparatus comprises detection window signal generating means for generating the detection window signal of the predetermined cycle, and sync. error correcting means for correcting (k−1) bit error of the sync. data sequence, wherein the sync. data sequence is detected and the (k−1) bit error of the sync. data sequence detected is corrected during the interval in which the detection window signal is generated. According to the thus arranged digital sync. detection apparatus, an ability for detecting a sync. pattern can be remarkably improved without degrading the probability that a pseudo-sync. signal will occur.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 10A and 10B are diagrams of waveforms of signals and to which references will be made in explaining a pattern dependency of error probability, respectively;

FIGS. 13A, 13B, 13C, 13D, 13E, and 13F are respectively timing charts used to explain operation of the digital synchronization detecting apparatus according to the second embodiment of the present invention.

DETAILED DESCRIPTION OF THE PREFERRED EMBODIMENTS

A digital data error correcting apparatus according to a first embodiment of the present invention, which is applied to a digital video tape recorder, will now be described with reference to FIGS. 5 to 10.

Figure 5:
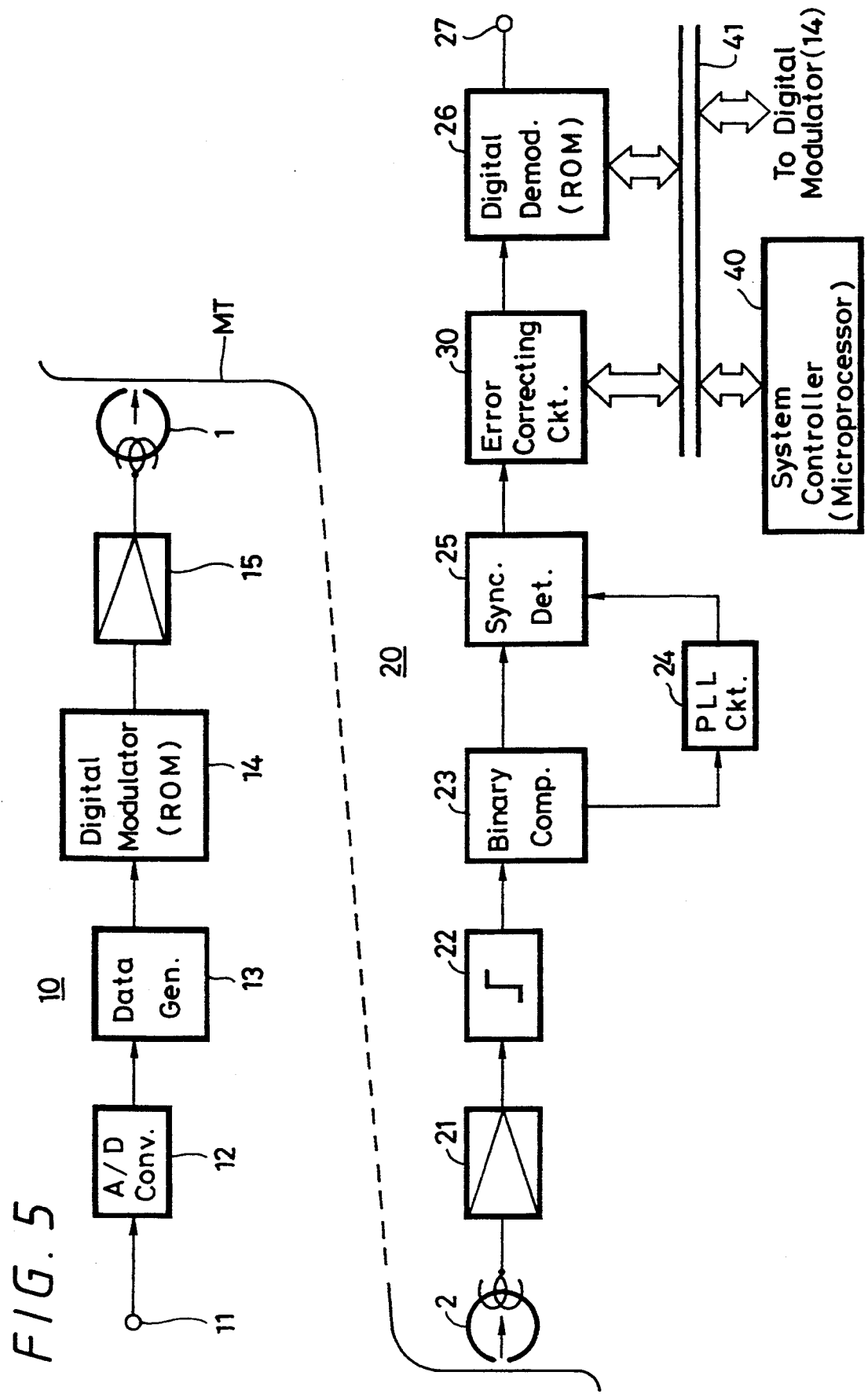
FIG. 5 is a block diagram showing an overall arrangement of a first embodiment of a digital data error correcting apparatus according to the present invention.
Figure 6:
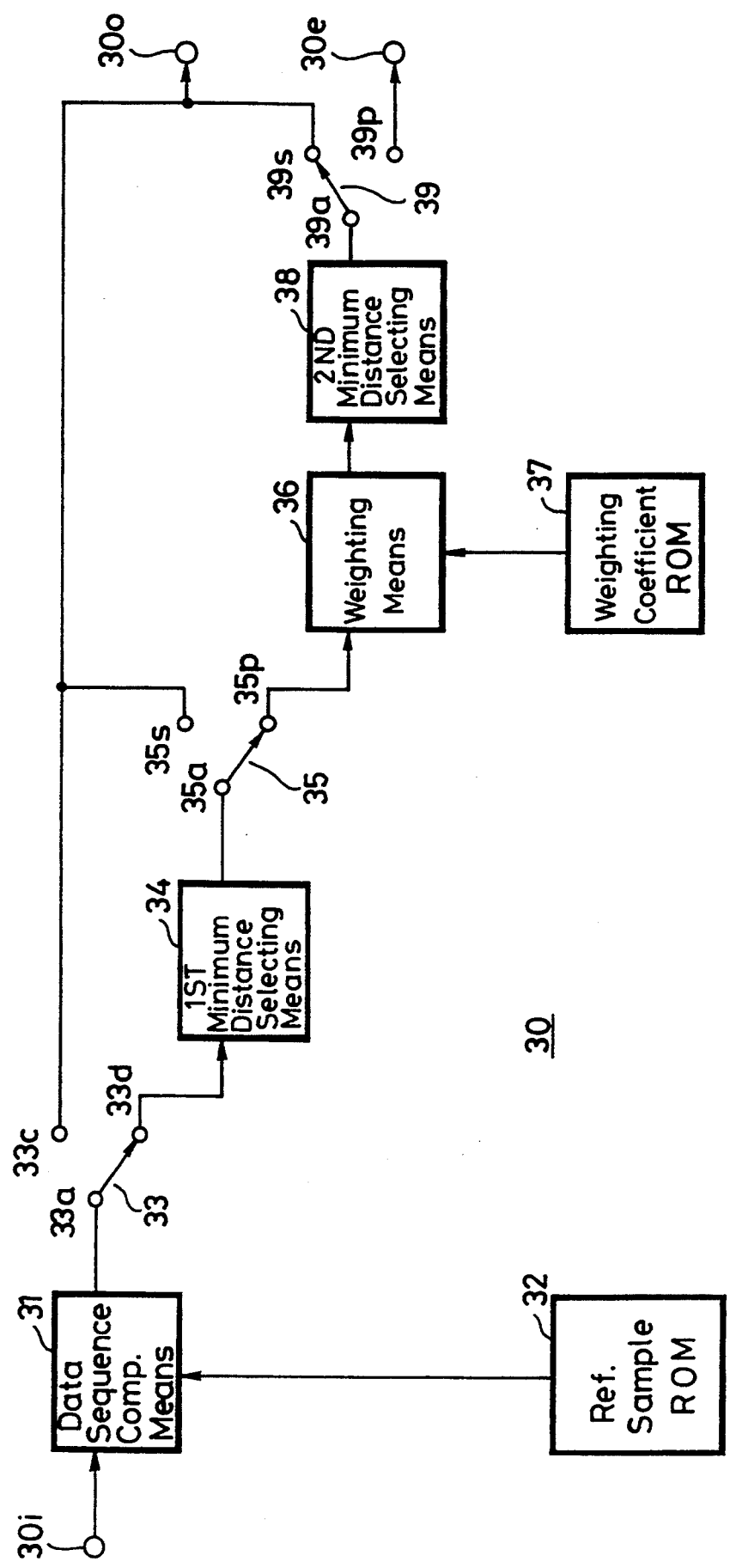
FIG. 6 is a functional block diagram showing an arrangement of a main portion of the first embodiment in which the digital data error correcting apparatus of the present invention is applied to a digital video tape recorder (i.e., digital VTR)

FIG. 5 of the accompanying drawings shows an overall arrangement of the first embodiment of the present invention. FIG. 6 of the accompanying drawings shows an arrangement of a main portion thereof.

As shown in FIG. 5, there is provided a recording system that is generally depicted by reference numeral 10. In the recording system 10, an analog video signal or the like applied to an input terminal 11 is supplied through an analog-to-digital (A/D) converter 12 and a data generator circuit 13 which generates recording data based on the system format.

A digital modulation (data conversion) circuit 14 includes a ROM table on which conversion codes shown on table 1 are stored. An output from the data generator circuit 13 is supplied to the digital modulation (ROM) circuit 14. Sample data from the digital modulation circuit 14 is supplied through a recording amplifier 15 to a magnetic head 1 and thereby directly recorded on a magnetic tape MT.

In a reproducing system that is generally depicted by reference numeral 20, an RF (radio frequency) signal reproduced from the magnetic tape MT by a magnetic head 2 is supplied through a playback amplifier 21 and a waveform equalizer circuit 22 to a binary comparator circuit 23, from which there is reproduced sample data.

An output from the binary comparator 23 is supplied to a PLL (phase-locked loop) circuit 24 and a synchronizing detecting circuit 25 and an output of the PLL circuit 24 is supplied to the synchronizing detecting circuit 25.

An output of the synchronizing detecting circuit 25 is supplied to an error correcting circuit 30. Corrected sample data from the error correcting circuit 30 is supplied to a digital demodulator circuit 26, in which it is demodulated to provide the original data. This original data is supplied to an output terminal 27. An arrangement of the error correcting circuit 30 will be described more fully later.

A system controller circuit 40 might be formed of a microprocessor and controls the digital modulator circuit 14, the digital demodulator circuit 26 and the error correcting circuit 30 through a data bus 41.

As shown in FIG. 6 of the accompanying drawings, a series of sample data is supplied from an input terminal 30i to a data sequence comparing means 31 in the error correcting circuit 30, in which it is compared with a reference sample stored in a ROM 32 bit by bit. An output of the data sequence comparing means 31 is supplied through a movable contact 33a and a fixed contact 33c of a switch 33 to an output terminal 30o and also supplied through a fixed contact 33d of the switch 30 to a minimum distance selecting means 34.

An output of the minimum distance selecting means 34 is supplied through a movable contact 35a and a fixed contact 35s of a switch 35 to the output terminal 30o and also supplied through a fixed contact 35p of the switch 35 to a weighting means 36.

The weighting means 36 multiplies the output of the minimum distance selecting means 34 with weighting coefficients stored in a ROM 37 bit by bit and supplies to multiplied results to a second minimum distance selecting means 38. The weighting coefficients will be described later.

An output from the second minimum distance selecting means 38 is supplied through a movable contact 39a and a fixed contact 39s of a switch 39 to the output terminal 30o and also supplied through a fixed contact 39p of the switch 39 to an output terminal 30e.

Operation of the first embodiment according to the present invention will be described below with reference also to FIGS. 7 to 10.

According to the present invention, on the basis of knowledge such that the probability at which an error takes place in respective bits forming reproduced sample data depends on the duration of a bit transition interval of each reproduced sample, i.e., bit pattern, the probability at which an error occurs in the transmission system is calculated in advance for every bit of all reference samples as shown on the table 1. Then, respective bits of the reference sample are weighted by weighting coefficients corresponding to the probability under which the error takes place, whereby the apparent distance can be extended to obtain adequate error correction capability.

Figure 7:
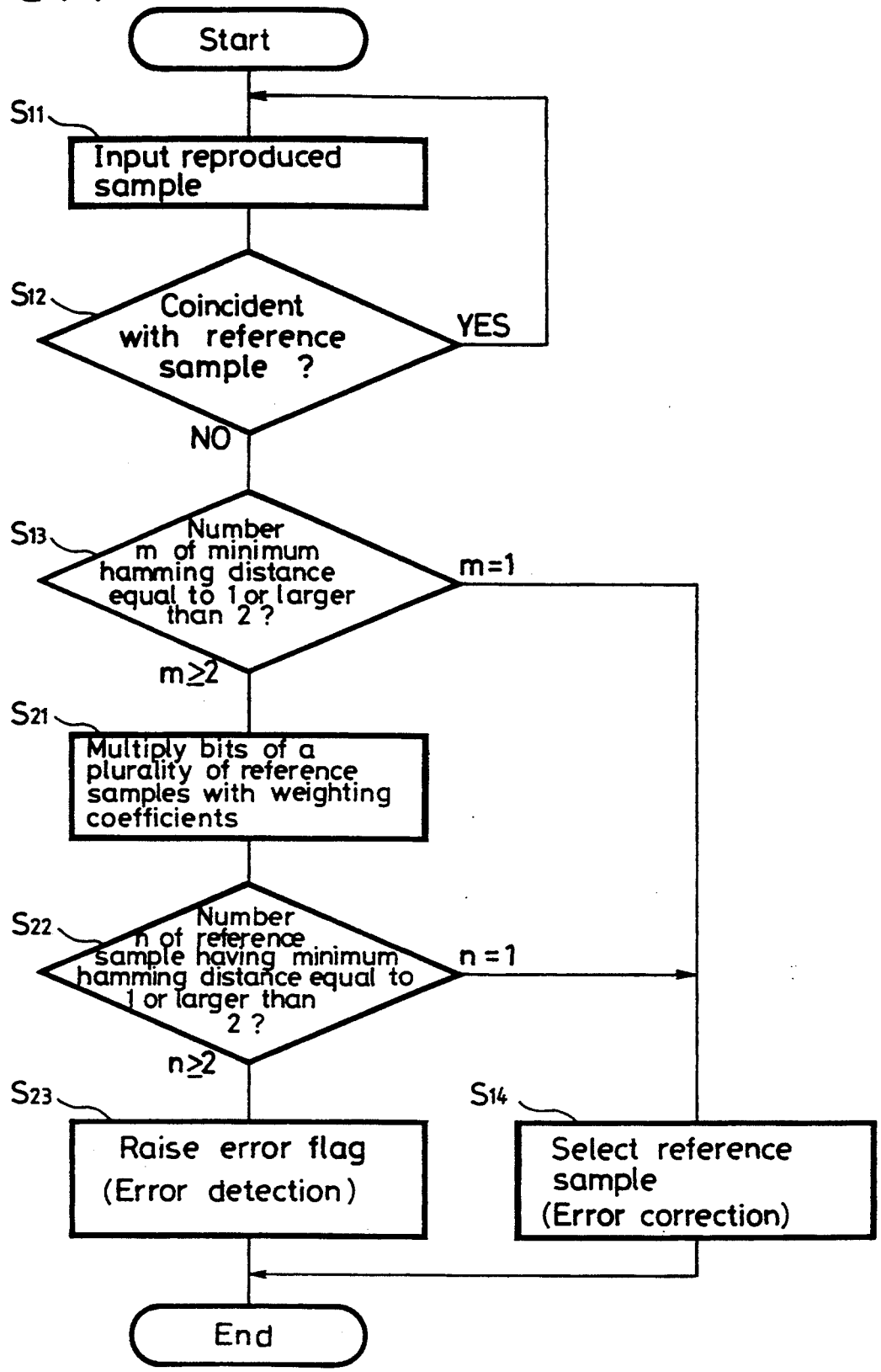
FIG. 7 is a flowchart to which references will be made in explaining operation of the main portion of the first embodiment of the present invention.

According to the first embodiment of the present invention, when a reproduced sample is supplied to the data sequence comparing means 31 in FIG. 6 in step S11 in FIG. 7, it is determined in the next decision step S12 whether or not the reproduced sample is coincident with the reference sample stored in the ROM 32. If the reproduced sample is coincident with the reference sample as represented by a YES at decision step S12, then the processing returns to step S11 because there is no error. In that case, the switch 33 connects its movable contact 33a to the fixed contact 33c.

If a NO is output at decision step S12, then the switch 33 is connected in the illustrated state in FIG. 6 and the processing proceeds to the next decision step S13. It is determined in decision step S13 by the first minimum distance selecting means 34 whether the number m of reference samples having the minimum Hamming distance relative to the input sample is equal to 1 or larger than 2.

Figure 1:
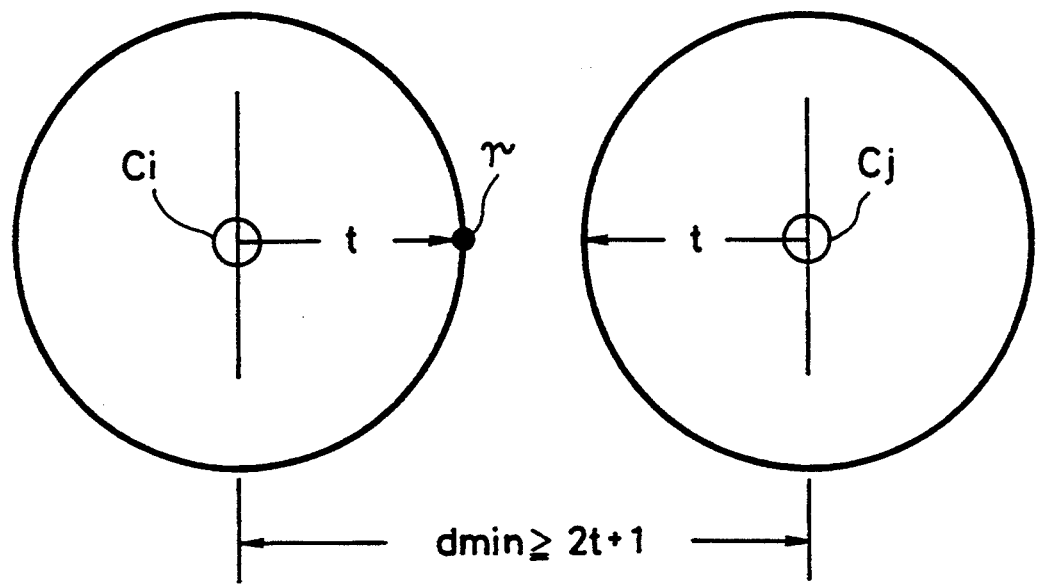
FIG. 1 is a conceptual diagram used to explain a Hamming distance.
Figure 2:
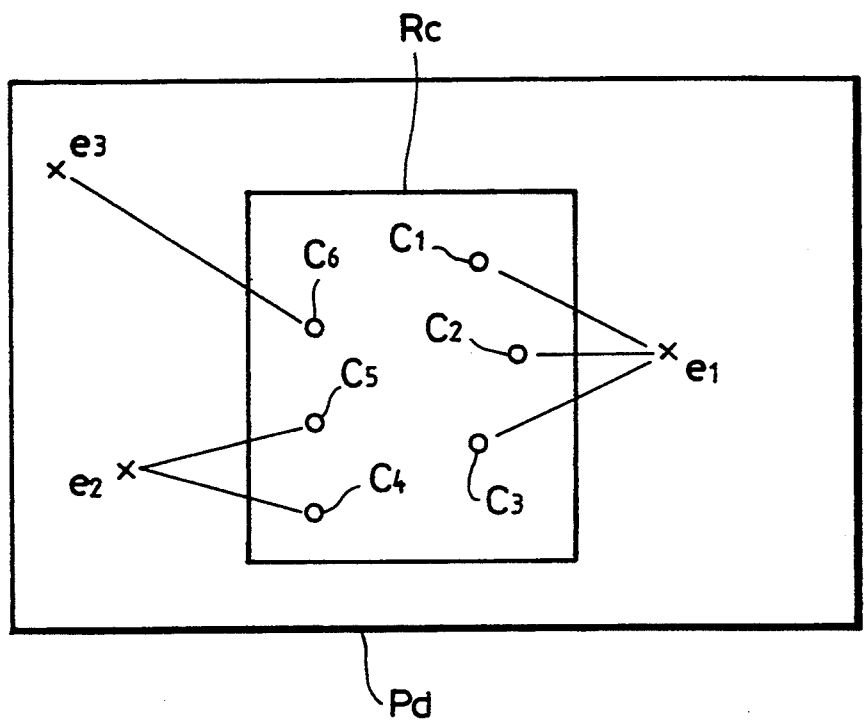
FIG. 2 is a conceptual diagram used to explain the occurrence of error.
Figure 3:
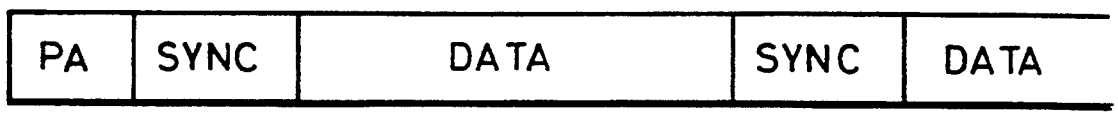
FIG. 3 is a conceptual diagram used to explain an example of a transmission format.
Figure 4:
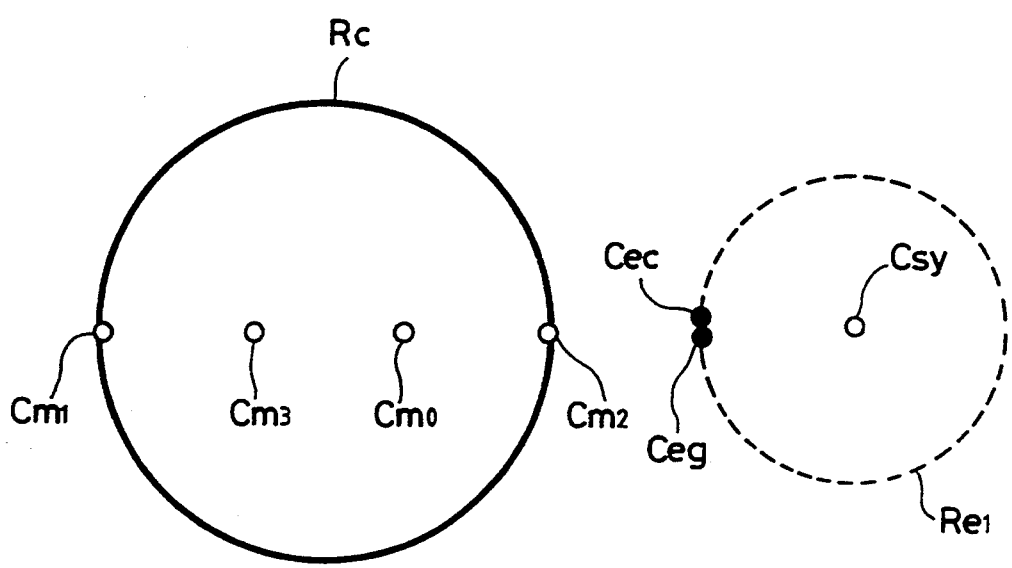
FIG. 4 is a conceptual diagram used to explain the occurrence of a synchronization error.

If there exists one reference sample of the minimum Hamming distance as shown by $e_1$ in FIG. 2, similar to the conventional minimum distance decoding method, then this reference sample is selected and the switch 35 connects its movable contact 35a to the fixed contact 35s. Therefore, the output of the minimum distance selecting means 34 is delivered to the output terminal 30o and the input sample is error-corrected in step S14.

According to this embodiment, if there exist a plurality of reference samples having equal Hamming distance relative to the input sample ($m \leq 2$) as shown by $e_2$ in FIG. 2, then the switch 35 is connected in the illustrated state and the weighting means 36 multiplies the bits forming a plurality of reference samples with weighting coefficients on the basis of error probability of respective bits in step S21.

Then, a distance between the weighted reference sample and the input sample is calculated by the second minimum distance selecting means 38. In decision step S22, it is determined whether the number n of the reference samples having the minimum Hamming distance relative to the input sample is equal to 1 or larger than 2.

If there exists one weighted reference sample having the minimum Hamming distance (n=1), then this reference sample is selected and the switch 39 is connected in the illustrated state, whereby an error in the input sample is corrected in step S14.

Therefore, the error correction capability can be improved considerably.

If on the other hand there exist a plurality of weighted reference samples having the minimum Hamming distance, then an error flag is raised and the switch 39 connects the movable contact 39a to the fixed contact 39p, thereby detecting an error in the input sample in step S23.

Figure 8:
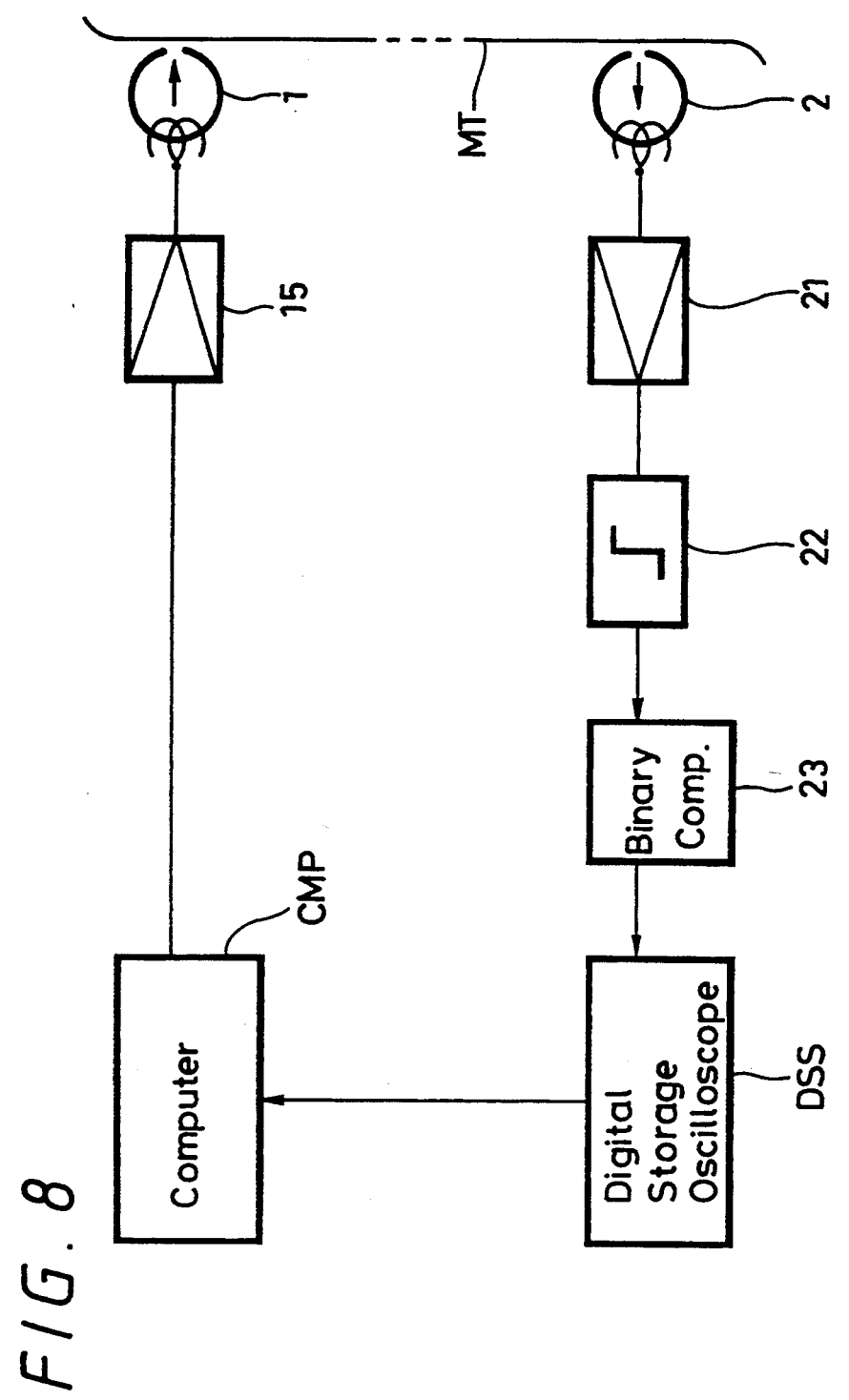
FIG. 8 is a block diagram used to explain how to measure a probability in which an error occurs.
Figure 9A:
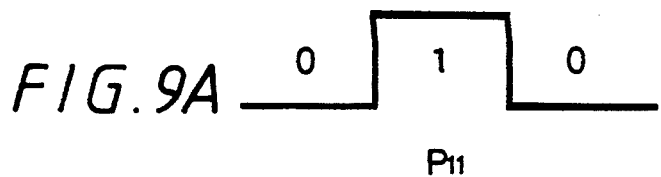
FIGS. 9A, 9B, 9C, 9D, and 9E are diagrams of waveforms of signals and to which references will be made in explaining a probability in which an error occurs in the transmission system, respectively.
Figure 9B:
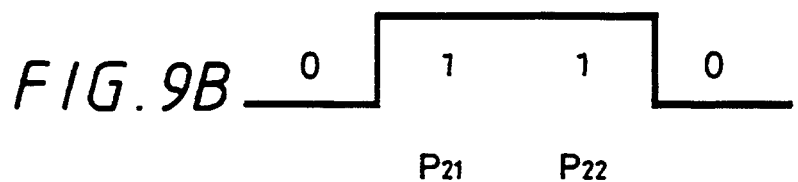
Figure 9C:
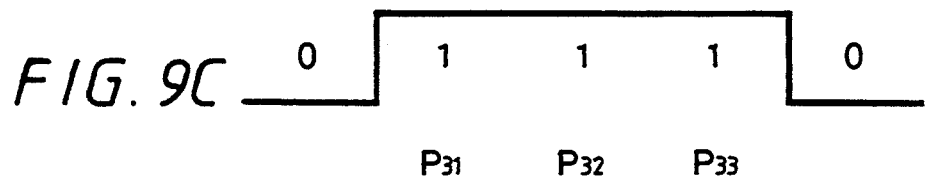
Figure 9D:
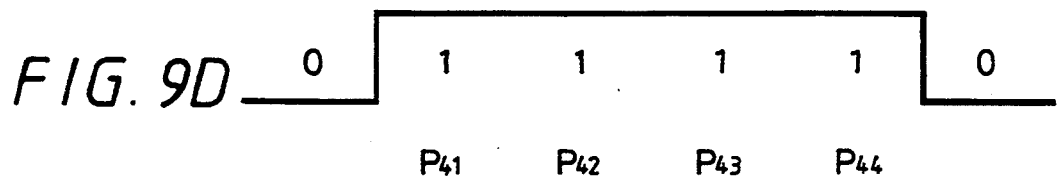
Figure 9E:
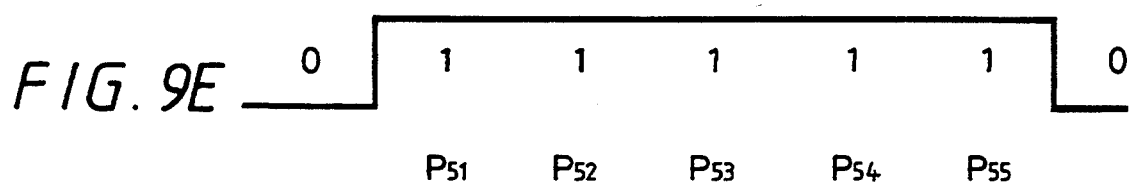

The error probability is calculated by comparing known data, which is transmitted through the transmission line, which is composed of, similarly to FIG. 5 the recording amplifier 15, the magnetic heads 1, 2, the tape MT, the playback amplifier 21 to the comparator 23 from a computer CMP and received data containing an error with original data by some suitable means such as a digital storage oscilloscope DSS as shown in FIG. 8.

According to this embodiment, bit transition intervals of respective reference samples fall in a range of from the minimum 1 bit to the maximum 5 bits as shown on the table 1 and expressed as shown in FIGS. 9A through 9E, for example.

Probability that an error will occur in the transmission system is determined as P11; P21, P22; P31 to P33; P41 to P44; and P51 to P55 at every bit within respective transition intervals.

In the case of the digital VTR, the above measurement shown in FIG. 8 yields the following values as the error probabilities P11 to P55 as shown on table 4 below.

TABLE 4

| P11 | $1 \times 10^{-4}$ |
|---|---|
| P21, P22 | $1 \times 10^{-7}$ |
| P31, P33 | $3 \times 10^{-7}$ |
| P32 | $7 \times 10^{-10}$ |
| P41, P44 | $5 \times 10^{-5}$ |
| P42, P43 | $3 \times 10^{-10}$ |
| P51, P55 | $8 \times 10^{-5}$ |
| P52, P54 | $1 \times 10^{-10}$ |
| P53 | $2 \times 10^{-12}$ |

The reproduced sample is obtained by shaping the reproduced RF signal by the binary comparator 23 and it is seen from table 4 that the error probability is high at inverted bits, or transitions.

In the magnetic recording, the shorter the recording wavelength becomes the more the level of the reproduced RF signal is lowered, thereby deteriorating the signal-to-noise (S/N) ratio. Therefore, if the bit transition interval is short, then the probability that an error will occur is increased.

If the recording wavelength is long, then the amount of jitter in the edge portion is increased and the probability that an error will occur is increased.

According to this embodiment, the inverse number of the above error probability Pij (P11 to P55) is employed as a weighing coefficient $axy$ of #y bit of the reference sample corresponding to an original signal "x" and stored in the ROM 37 shown in FIG. 6.

The weighting means 36 multiplies the respective bits of the reference sample with this weighting coefficient.

If the sample Spb="011001001" is obtained upon playback as described above, then the sample Spb has different bits of #2, #3 relative to reference samples Sr0="011001101" and Sr1="011000001" corresponding to the original signals and "1" on the table 1 and also has the same Hamming distance [1] for the two reference samples Sr0 and Sr1.

Weighted Hamming distances dwp0 and dwp1 between the reproduced sample Spb and the two reference samples Sr0, Sr1 are considerably different as follows.

$$dwp0 = a02 = 1/P22 = 1 \times 10^7$$

$$dwp1 = a13 = 1/P53 = 1 \times 10^{12}$$

Therefore, the reference sample that is closest to the reproduced sample Spb is Sr0.

The probability that an error will occur in each bit of both reference samples Sr0, Sr1 becomes as shown in FIGS. 10A, 10B, respectively, due to the pattern dependency described above.

Similarly, weighted Hamming distances dwp2 to dwp7 between the reproduced sample Spb and reference samples Sr2 to Sr7, each having the ordinary Hamming distance of [2] or more are respectively expressed by the following equation (1):

$$dwp2 = \alpha 25 + \alpha 23 = \frac{1}{P33} + \frac{1}{P42} \approx 3.3 \times 10^9 \quad (1)$$

$$dwp3 = \alpha 36 + \alpha 33 + \alpha 31 = \frac{1}{P51} + \frac{1}{P54} + \frac{1}{P21} \approx 1 \times 10^{10}$$

$$dwp4 = \alpha 45 + \alpha 44 + \alpha 43 = \frac{1}{P43} + \frac{1}{P44} + \frac{1}{P31} \approx 3.3 \times 10^9$$

$$dwp5 = \alpha 57 + \alpha 55 + \alpha 54 + \alpha 53 = \frac{1}{P22} + \frac{1}{P32} + \frac{1}{P33} + \frac{1}{P31} \approx 1.4 \times 10^9$$

$$dwp6 = \alpha 67 + \alpha 66 + \alpha 64 + \alpha 62 + \alpha 61 = \frac{1}{P42} + \frac{1}{P43} + \frac{1}{P51} + \frac{1}{P53} + \frac{1}{P54} \approx 5 \times 10^{12}$$

$$dwp7 = \alpha 77 + \alpha 76 + \alpha 75 + \alpha 74 + \alpha 73 = \frac{1}{P32} + \frac{1}{P33} + \frac{1}{P21} + \frac{1}{P22} + \frac{1}{P31} \approx 1.4 \times 10^9$$

minimum distance codes $c_4$, $c_5$ for incorrect If the $e_2$ outside the modulation code space Rc exists as shown in FIG. 2 and the codes $c_4$, $c_5$ are respectively the reference samples Sr2, Sr4 corresponding to the original signals "2" and "4" on the table 1 or the reference samples Sr5, Sr7 corresponding to the original signals "5" and "7", then equation (1) reveals that the weighted Hamming distances dwp2, dwp4; dwp5, dwp7 with respect to the reference sample pairs Sr2, Sr4; Sr5, Sr7 become equal. Thus, errors can be detected as shown in step S23 in FIG. 7.

While the weighting coefficient ROM and the weighting calculating circuit are independently provided as described above for simplicity, the present invention is not limited thereto and values, which are judged in advance by the calculation with respect to all data outside the modulation code space may be stored in the digital demodulation ROM.

While the 3–9 conversion was described by way of example for simplicity, the present invention is not limited thereto and can be similarly applied to other conversion systems such as 8–10 conversion system, 8–14 conversion system or the like.

As described above in detail, according to the first embodiment of the present invention, according to the minimum distance decoding method, when a plurality of reference samples whose minimum Hamming distances with respect to the input sample are equal exist, the bits are added with weights on the basis of the probability that an error will occur in each bit. Then, an error is corrected by selecting a reference sample whose distance with respect to the input sample is shortest from the plurality of reference samples. It is possible to obtain a digital error correcting apparatus in which an error correction capability can be remarkably improved in a digital signal transmission system when a digital modulation code is decoded.

A digital synchronization (sync.) detecting apparatus according to a second embodiment of the present invention, which is applicable to a digital VTR, will be described with reference to FIGS. 11 to 13.

Figure 11:
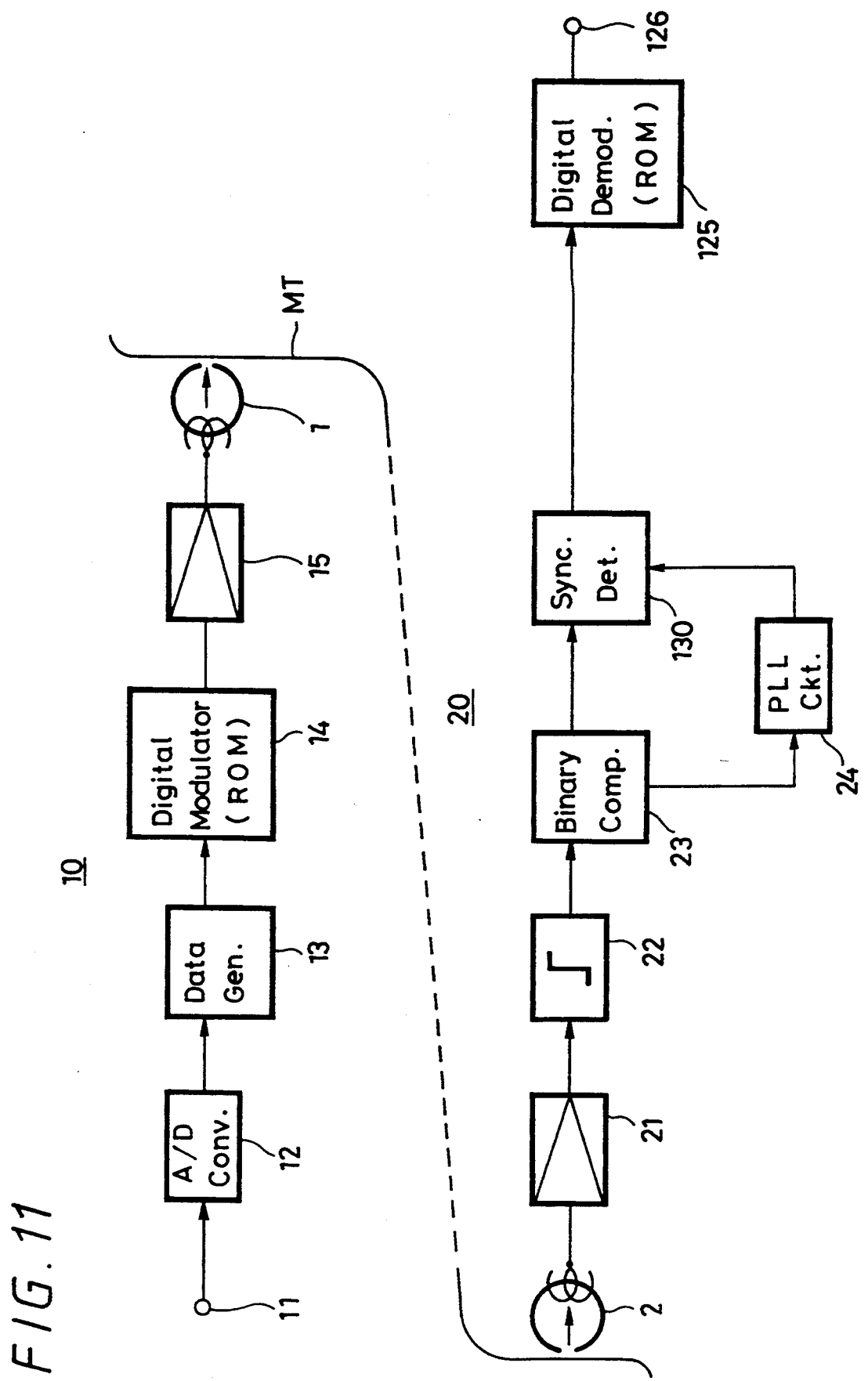
FIG. 11 is a block diagram showing a second embodiment of the present invention.

FIG. 11 of the accompanying drawings shows in block form an overall arrangement of the second embodiment of the present invention. A main portion thereof is illustrated in FIG. 12 of the accompanying drawings. In FIG. 11, like parts corresponding to those of FIG. 5 are marked with the same references and therefore need not be described.

As shown in FIG. 11, a sync. detector circuit 130 is supplied with the output of the binary comparator 23 and the output of the PLL circuit 24. An output of the sync. detector circuit 130 is supplied to a digital demodulator circuit 125, in which it is demodulated to provide the original data. The original data is supplied to an output terminal 126.

The arrangement of the sync. detector circuit 130 will be described more fully with reference to FIG. 12.

Figure 12:
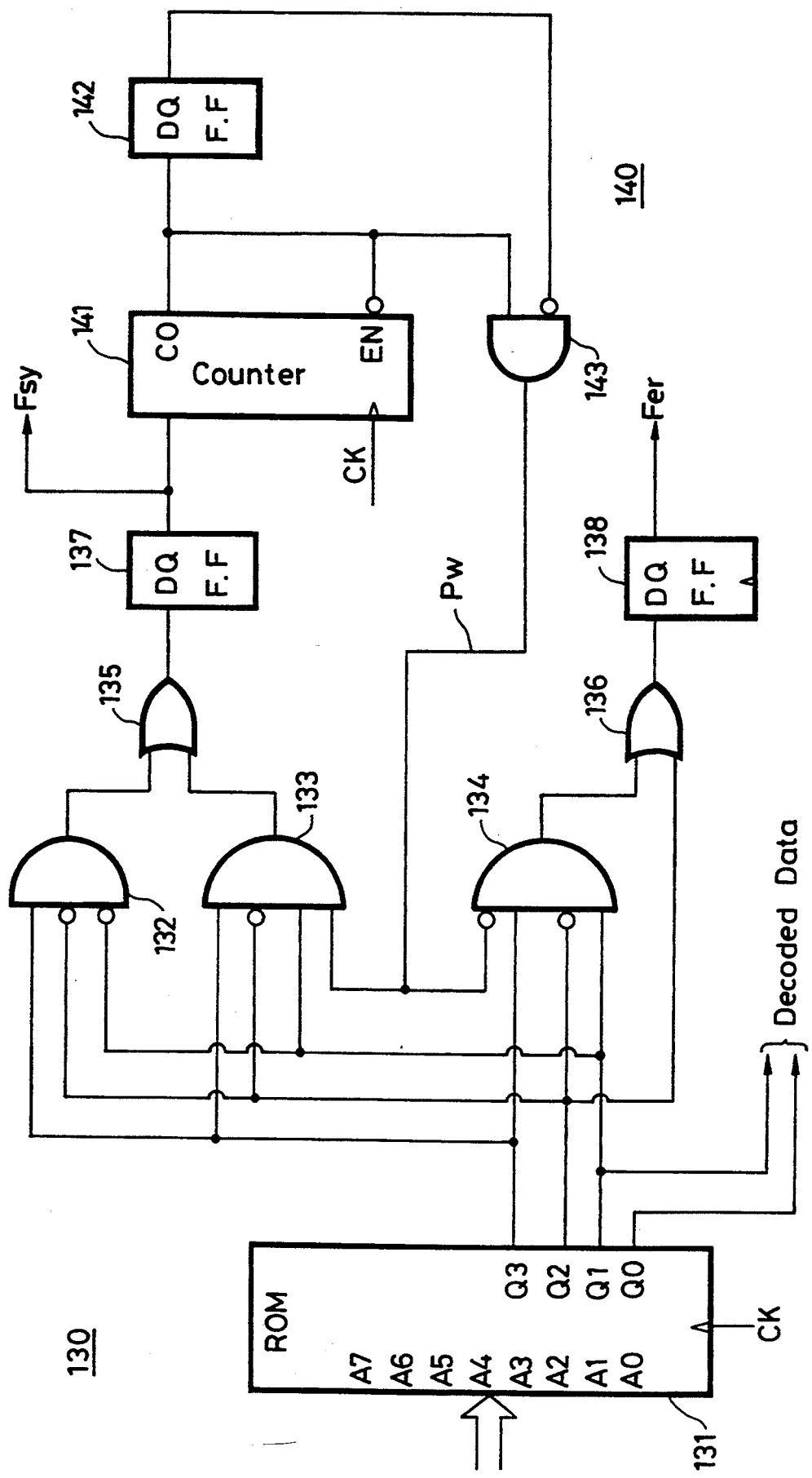
FIG. 12 is a block diagram showing an overall arrangement of a main portion of the second embodiment in which a digital synchronization detecting apparatus of the present invention is applied to the digital video tape recorder.

As shown in FIG. 12, the sync. detector circuit 130 according to the second embodiment comprises a ROM 131, a detection unit composed of three AND gates 132, 133, 134, two OR gates 135,136 and two D-type flip-flops 137,138 and a detection window signal generator circuit 140 composed of a counter 141, a D-type flip-flop 142 and an AND gate 143.

The ROM 131 includes a data table into which 8-bit data is supplied and from which 4-bit data is output as shown on the following table 5. Of the 4-bit output, low-order 2 bits Q0, Q1 are used as decoding data and high-order 2 bits Q2, Q3 are used as sync. bits or error bits.

Of the 4 bits output from the ROM 131, #1, #3 bits Q1, Q3 are commonly supplied to AND gates 133 and 134 in positive phase and #2 bit Q2 is inverted in phase and commonly supplied to the AND gates 132 through 134. The #1 bit Q1 is inverted and supplied to AND gate 132 and the #3 bit Q3 is supplied directly to AND gate 132.

Outputs of the AND gates 132, 133 are supplied through the OR gate 135 to the first flip-flop 137 which derives an sync. flag Fsy.

The #2 output bit Q2 from the ROM 131 and an output from the AND gate 134 are supplied through the OR gate 136 to the second flip-flop 138 which derives an error flag Fer.

The sync. flag Fsy from the flip-flop 137 is supplied to the counter 141 in the detection window signal generator circuit 140.

The counter 141 has a preset value that results from subtracting a clock delay time from the repetitive cycle of the sync. pattern. Therefore, the counter 141 is responsive to the sync. flag Fsy to count a clock CK corresponding to the repetitive cycle and then stopped.

An output of the counter 141 is supplied to the flip-flop 142 and the AND gate 143, and an output of the flip-flop 142 is inverted and then fed to the AND gate 143.

An output of the AND gate 143 is supplied in positive phase to the AND gate 133 in the detecting unit and inverted and fed to the AND gate 134.

Operation of the main portion of the second embodiment according to the present invention will be described with reference to also FIGS. 13A through 13F.

This invention senses the periodicity of the sync. pattern and considerably improves the detection capability of sync. pattern by error-correcting the sync. pattern during the interval of the detection window signal of a predetermined period, without degrading the probability that a pseudo-sync. signal will be generated.

As shown in FIG. 13A, according to the second embodiment, a sync. pattern of one byte, for example, follows each m-byte data DATA and the repetitive cycle of the sync. pattern becomes m+1 bytes, for example.

The ROM 131 includes the data table shown on the following table 5 and outputs 7 kinds of data in response to a wide variety of input data.

TABLE 5

| INPUT CODE/ ORIGINAL SIGNAL | INPUT DATA A #7654 | 3210 | OUTPUT DATA Q #3210 |
|---|---|---|---|
| Csy | 0011 | 1110 | 1000 |
| Cea | 1011 | 1110 | |
| Ceb | 0111 | 1110 | |
| Ced | 0010 | 1110 | 1000 |
| Cee | 0011 | 0110 | |
| Cef | 0011 | 1010 | |
| Ceh | 0011 | 1111 | |
| Cec | 0001 | 1110 | 1010 |
| Ceg | 0011 | 1100 | |
| 0 | 0011 | 0011 | 0000 |
| 1 | 0110 | 0111 | 0001 |
| 2 | 0001 | 1100 | 0010 |
| 3 | 0011 | 0001 | 0011 |
| ERROR | OTHERS | | 1111 |

From table 5 it is seen that the same output data "1000" as the sync. pattern Csy is allocated to six one-bit error patterns Cea, Ceb; Ced, Cee, Cef; Ceh whose Hamming distance relative to the modulation code becomes [2] or more. The six error patterns Cea through Ceh are all processed by the sync. detector circuit 130 similarly to the sync. pattern Csy.

Since in the six error patterns Cea to Ceh the probability that the sync. pattern will become erroneous is higher than the modulation code, the six error patterns Cea to Ceh are subjected to the error correction process without any condition.

High-order 3 bits Q3, Q2, Q1 of the ROM 131 are "1", "0", "0" and are respectively supplied to a positive phase input terminal and two inverting input terminals of the AND gate 132. Then, the output of the AND gate 132 goes to "1" and supplied through the OR gate 135 to the first flip-flop 137.

Consequently, the flip-flop 137 derives the sync. flag Fsy which is illustrated in FIG. 13B.

In response to the sync. flag Fsy supplied to the counter 141 of the detection window signal generator circuit 140, the counter 141 counts the clock corresponding to the preset value that results from subtracting the clock delay time from the repetitive cycle of the sync. pattern and then stops the counting. An output of the counter 141 becomes as shown in FIG. 13C.

The output of the counter 141 is supplied to the D-type flip-flop 142 which then generates an output shown in FIG. 13D.

The AND gate 143 is supplied with an inverted output of the D-type flip-flop 142 and the output of the counter 141 so that the AND gate 143 generates an output shown in FIG. 13E. This output of the AND gate 143 has the same timing as that of the output of the counter 141 as shown in FIG. 13E, and supplied to the AND gates 133, 134 as a detection window signal Pw.

When any one of one-bit error patterns Cec and Ceg whose Hamming distance relative to the modulation code becomes [1] is supplied to the ROM 131, as shown on the table 5, the high-order 3 bits Q3, Q2, Q1 of the ROM 131 go to "1", "0", "1" and only the bit Q2 is inverted and then supplied to the AND gates 133, 134.

The detection window signal Pw is supplied to the AND gate 133 in positive phase and also supplied to the AND gate 134 in opposite phase.

Therefore, when the detection window signal Pw exists, the output of the AND gate 133 goes to "1" and is supplied through the OR gate 135 to the flip-flop 137 so that the flip-flop 137 is driven to output the sync. flag Fsy.

In other words, the one bit error patterns Cec, Ceg whose Hamming distance relative to the modulation code becomes [1] during the detection window signal Pw is ON can be error-corrected, thereby improving the sync. pattern detection capability considerably.

A pseudo-sync. pattern never occurs because the error correction interval is specified.

In the absence of the detection window signal Pw, the output of the AND gate 134 goes to "1" and is supplied through the OR gate 136 to the flip-flop 138 so that the flip-flop 138 is driven to output the error flag Fer. Thus, the error can be detected.

Since the one bit error patterns Cec, Ceg whose Hamming distance between them and the modulation code Cm2 is [1] and whose distance between them and the sync. pattern Csy is [1] have equal most likely patterns as mentioned before, the one bit error patterns Cec and Ceg cannot correct errors in #1 and #5 bits of the sync. pattern Csy.

If there exist bits that cannot be error-corrected, then the probability that an error will occur in the code is substantially dominated by the probability that an error will occur in bit that cannot be error-corrected.

By way of example, if the probability in which 8-bit sample data become error is taken as Ps, when the #1 and #5 bits of the sync. pattern Csy cannot be error-corrected, then a probability Pe1 that an error will occur in code word is expressed as:

$$Pe1 = 2Ps/8$$

According to this embodiment, errors of all bits in the sync. pattern Csy can be error-corrected during the interval including that of the detection window signal Pw. Errors cannot be corrected only when error of more than 2 bits of 8 bits occurs.

Therefore, the error probability Pe2 according to this embodiment is given as:

$$Pe2 = {}_8C_2 \cdot Ps^2 = 28Ps^2$$

If $Ps \leq 10^{-2}$, then the error detection capability can be improved considerably as compared with that of the prior art.

In most cases, the sync. pattern is detected in a sync. to sync. fashion. If the sync. pattern is detected once in three times as shown in FIGS. 13B to 13E even though the sync. pattern is not detected, according to the example of the above values, the conventional error probability Pt1 and the error probability Pt2 of this embodiment are expressed as:

$$Pt1 = Pe1^3 = 1.6 \times 10^{-11}$$

$$Pt2 = Pe2^3 = 2.2 \times 10^{-15}$$

Therefore, it is to be understood that the error probability of this embodiment can be improved greatly.

In the case of synchronization disorder, of error patterns shifted by one bit from the sync. pattern, such error pattern whose Hamming distance $d_H$ between it and the modulation code is more than K ($K \geq 3$) is regarded as a sync. pattern by which errors can be corrected.

A detection window signal in which a preamble, for example, is continuously detected twice may be formed on the beginning of the track and immediately after the EDIT gap. Then, after the preamble is continuously detected twice, the above sync. detection window may be opened.

While the error pattern, which is shifted by one bit from the sync. pattern whose Hamming distance between it and the modulation code is more than 2, is corrected during the detection window interval for simplicity as described above, it is customary that (k−1)-bit error of a sync. pattern whose Hamming distance between it and the modulation code is more than k can be corrected during the detection window interval.

While the 4-8 conversion was described by way of an example for simplicity, the present invention is not limited thereto and can be similarly applied to other conversion systems such as 8–10 modulation, 8–14 modulation or the like.

As set out in detail, according to the present invention, since the detection interval of the predetermined cycle is set in the sync. pattern of the predetermined cycle whose Hamming distance between it and the digital modulation code is k or more by the detection window signal generating circuit and the (k−1) bit error of the sync. pattern is corrected during this detection interval, the digital sync. detecting apparatus can be obtained, in which the probability that the pseudo-sync. signal will occur can be prevented from being deteriorated and the capability for detecting the sync. pattern can be improved considerably.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A digital data error correcting apparatus which includes data sequence comparing an means for comparing input data sequence supplied thereto via a predetermined transmission system and a group of reference data sequences of the same length of said input data sequence at every bit and data sequence selecting means for selecting from said reference data sequences a reference data sequence whose distance relative to said input data sequence is minimized on the basis of an output of said data sequence comparing means, comprising:

weighting means for adding weighting coefficients based on the probability that an error will occur in said predetermined transmission system to every bit of said group of reference data sequence; and second data sequence selecting means for selecting data sequence whose distance relative to said input data sequence is minimized from a plurality of data sequences corresponding to a plurality of reference data sequences and which are weighted by said weighting means when said plurality of reference data sequences are selected by said data sequence selecting means.

2. The digital data error correcting apparatus according to claim 1, further comprising a read-only memory (ROM) in which said reference data sequences are stored.

3. The digital data error correcting apparatus according to claim 1, wherein said weighting means is comprised of multiplying means and a read-only memory (ROM) in which weighting coefficients are stored.

4. The digital error correcting apparatus according to claim 1, wherein said predetermined transmission system is comprised of a recording amplifier, a magnetic head, a magnetic tape, a playback amplifier, a waveform equalizer circuit and a binary comparator.

5. The digital error correcting apparatus according to claim 1, wherein said probability that an error will occur is obtained by comparing received data containing errors with original data.

6. A digital synchronizing detection apparatus for detecting a synchronizing data sequence of a predetermined pattern inserted into a series of input data sequences at a predetermined cycle and whose distance relative to said input data sequences becomes more than k from said series of input data sequence, comprising:

detection window signal generating means for generating a detection window signal of said predetermined cycle; and synchronizing error correcting means for correcting (k−1) bit error of said synchronizing data sequence, wherein said synchronizing data sequence is detected and said (k−1) bit error of said detected synchronizing data sequence is corrected during an interval in which said detection window signal is generated.

7. The digital synchronizing detection apparatus according to claim 6, further comprising a synchronizing detecting circuit and a digital demodulating circuit which demodulates an output of said synchronizing detecting circuit to provide original data.

8. The digital synchronizing detection apparatus according to claim 7, wherein said synchronizing detecting circuit comprises a detection unit including a read-only memory (ROM), three AND gates, two OR gates and two D-type flip-flops, and said detection window signal generating means.

9. The digital synchronizing detection apparatus according to claim 8, wherein said detection window signal generating means is comprised of a counter, a D-type flip-flop and an AND gate.

10. The digital synchronizing detection apparatus according to claim 8, wherein said read-only memory has a data table to which 8-bit data is input and from which 4-bit data is output.

11. The digital synchronizing detection apparatus according to claim 10, wherein low-order 2 bits of said 4-bit output data function as decoding data and high-order 2-bits thereof function as synchronizing bits or error bits.

* * * * *